United States Patent

Mizusawa et al.

[11] Patent Number: 6,038,428
[45] Date of Patent: Mar. 14, 2000

[54] POWER CONTROL CIRCUIT FOR TRANSMISSION APPARATUS

[75] Inventors: Nishiki Mizusawa; Tsutomu Sato, both of Kanagawa, Japan

[73] Assignee: Sony Corporation, Tokyo, Japan

[21] Appl. No.: 08/636,411

[22] Filed: Apr. 23, 1996

[30] Foreign Application Priority Data

Apr. 27, 1995 [JP] Japan .................................. 7-104165

[51] Int. Cl.[7] .............................. H01Q 11/12; H04B 1/04
[52] U.S. Cl. .............................. 455/69; 455/126; 330/129
[58] Field of Search .............................. 455/69, 115, 126, 455/127, 522, 129; 330/129, 136, 284; 331/183

[56] References Cited

U.S. PATENT DOCUMENTS

| | | | |
|---|---|---|---|
| 5,313,658 | 5/1994 | Nakamura | 455/69 |
| 5,548,826 | 8/1996 | Sayers | 455/126 |
| 5,574,993 | 11/1996 | Kobayashi et al. | 455/126 |
| 5,646,578 | 7/1997 | Loh et al. | 330/284 |

FOREIGN PATENT DOCUMENTS

| | | |
|---|---|---|
| 0603867 | 6/1994 | European Pat. Off. . |
| 0645899 | 3/1995 | European Pat. Off. . |
| 3602064 | 7/1987 | Germany . |

*Primary Examiner*—Reinhard J. Eisenzopf
*Assistant Examiner*—Sam Bhattacharya
*Attorney, Agent, or Firm*—Jay H. Maioli

[57] ABSTRACT

A modulated signal from an orthogonal modulator is supplied to a mixer, and a second local oscillating signal from a second local oscillator is supplied through a variable gain amplifier to the mixer. A transmission signal from the mixer is supplied through a step-attenuator (ATT) to a power amplifier, and further supplied through a directional coupler and an isolator to an antenna. A signal from the directional coupler is supplied through a detector to a comparator, and a reference voltage from a reference voltage setting unit is supplied to the comparator. An output from the comparator is supplied to a control unit of the variable gain amplifier and a gain is thereby controlled such that a DC voltage from the detector and the reference voltage from the reference voltage setting unit become equal to each other. Further, an attenuation amount of the step-attenuator is set by an attenuation amount setting unit in accordance with a transmission output control signal from a base station.

16 Claims, 6 Drawing Sheets

POWER CONTROL CIRCUIT FOR TRANSMISSION APPARATUS

BACKGROUND OF THE INVENTION

The present invention relates to a power control circuit for use with a transmitting circuit of a subscriber unit in a radio communication system, for example, a portable telephone system.

PDC (personal digital cellular phone system which will hereinafter simply be referred to as a "portable telephone system") is now available as the standard of radio communication system in Japan. This digital cellular phone system comprises a base station and a mobile station or a subscriber unit, where the transmitted output power of the subscriber unit is controlled by transmitting a transmitted output control signal for controlling a transmitted power from the base station to the subscriber unit. In the specification of the portable telephone system, in the case of a subscriber unit whose transmission power is 0.8 W, it is requested that a transmission output power is controlled at the step of 4 dB in a range of from 0 to −20 dB where the maximum transmission output power is 0 dB.

Japanese laid-open patent publication No. 6-196939 describes a power control circuit for controlling a transmission output power as described above. Circuits shown in FIGS. 1 and 2 are proposed as examples of such a power control circuit.

In the circuit shown in FIG. 1, baseband digital audio data I, Q, which result from A/D-converting audio signals, are supplied through an input terminal 40 to an orthogonal modulator 41, in which they are modulated by using a first local oscillation signal from a first local oscillator 42 as a carrier signal.

A modulated signal from the orthogonal modulator 41 is supplied to a mixer 43 which mixes this modulated signal with a second local oscillation signal supplied thereto from a second local oscillator 42 to provide a carrier signal of 900 MHz band, for example. A transmitted signal from the mixer 43 is supplied through a first variable gain amplifier 45, a divider 46 and a second variable gain amplifier 47 to a power amplifier 48. Further, a transmitted output from the power amplifier 48 is supplied through a directional coupler 49, and an isolator 50 to an antenna 51.

A signal from the divider 46 is supplied through a first detector 52 to a comparator 53. A signal from the directional coupler 49 is supplied to a step-attenuator 54, and a signal from the step-attenuator 54 is supplied through a second detector 55 to the comparator 53. An output from the comparator 53 is supplied to a control unit of the second variable gain amplifier 47.

As a consequence, the gain of the second variable gain amplifier 47 is controlled in such a manner that the level of the signal from the first detector 52 and the level of the signal from the second detector 55 become equal to each other. In this circuit, the first variable gain amplifier 45 is provided in order to correct a fluctuation of an output power of the orthogonal modulator 41. Then, the gain of the first variable gain amplifier 45 is adjusted by a half-fixed signal from a terminal 56 such that the output power of the orthogonal modulator 41 is matched with an optimum operation point with a well-balanced distortion characteristic.

In this circuit, an attenuation amount of the step-attenuator 54 is set in accordance with a transmission output control signal supplied to a terminal 57 from the base station. Then, when a feedback control is effected such that a difference between the level attenuated by the step-attenuator 54 from the output level of the power amplifier 48 and the level of the transmission signal from the mixer 43 becomes constant, the transmission output power supplied to the antenna 51 is controlled in accordance with an attenuation amount set by this step-attenuator 54.

Specifically, a transmission power of the subscriber unit incorporating this circuit is identified by the base station side as a reception level. Then, the base station side transmits a transmission output control signal to the base station such that the transmission output power becomes a lowest level necessary for reception. An attenuation amount of the step-attenuator 54 is set in accordance with the transmission output control signal. Further, the transmission output power supplied to the antenna 51 is controlled in response to the attenuation amount set in the step-attenuator 54, whereby the transmission output power can be set with substantially the same accuracy as that of the step-attenuator 54.

If the attenuation amount, for example, of the step-attenuator 45 is set at the step of 4 dB in a range of 20 dB, then in the case of the subscriber unit whose transmission output power is 0.8 W, the transmission output power can be controlled at the step of 4 dB in a range of from 0 to −20 dB where the maximum transmission output power is 0 dB.

In this manner, the transmission output power of the subscriber unit is controlled in accordance with the transmission output control signal transmitted from the base station to the subscriber unit. Thus, it is possible to prevent another base station from being disturbed by the interference which will occur due to an excessively large transmission level. Also, a consumption of a battery incorporated in the subscriber unit can be lessened, and a life of the battery can be extended.

However, in this circuit, the output supplied from the first detector 52 to the comparator 53 is used as a reference, and should be held constant. As a result, a voltage or the like of the signal that was supplied to the terminal 56 in order to adjust the gain of the first variable gain amplifier 45 should be compensated in temperature, which requires a complex circuit arrangement on the outside.

On the other hand, in the circuit shown in FIG. 2, instead of the signal from the first detector 52 shown in FIG. 1, a fixed reference voltage applied to a terminal 58 is supplied to the comparator 53, while the rest of the arrangement is similar to that of FIG. 1. In this circuit, the gain of the second variable gain amplifier 47 is controlled such that the signal from the second detector 55 and the fixed reference voltage from the terminal 58 become equal to each other.

Therefore, similarly to the circuit shown in FIG. 1, the transmission output power supplied to the antenna 51 is controlled in response to the attenuation amount set in the step-attenuator 54, whereby the transmission output power can be set with substantially the same accuracy as that of the step-attenuator 54. In this case, since the fixed reference voltage is supplied to the comparator 53 from the terminal 58, the signal from the first detector 52 shown in FIG. 2 need not always be constant, the voltage or the like of the signal that was supplied to the terminal 56 in order to adjust the gain of the first variable gain amplifier 45 need not be compensated in temperature or the like.

However, this circuit also needs the first variable gain amplifier 45 in order to correct a fluctuation of the output power of the orthogonal modulator 41 such that the output power of the orthogonal modulator 41 is matched with the optimum operation point with a well-balanced distortion characteristic, and the gain of the first variable gain amplifier 45 has to be adjusted by the signal from the terminal 56. To this end, also in this circuit, the voltage or the like of the signal that was supplied to the terminal 56 in order to adjust the gain of the first variable gain amplifier 45 has to be compensated in temperature, which requires a complex circuit arrangement on the outside.

SUMMARY OF THE INVENTION

In view of the aforesaid aspect, it is an object of the present invention to provide a power control circuit and a power control method in which a transmission output can be controlled by a simple arrangement.

According to a first aspect of the present invention, there is provided a power control circuit for use in a transmitter wherein a signal transmission power level is controlled by a power level control signal. This power control circuit is comprised of a modulator for modulating a first local oscillating signal by an inputted signal to be transmitted, a mixer for mixing the modulated signal with an outputted signal from a second local oscillating signal, the outputted signal being controlled by a gain control amplifier, an attenuator for attenuating an outputted signal from the mixer, attenuation being controlled according to the power level control signal, a power amplifier for amplifying an outputted signal from the attenuator for radiating an amplified outputted signal via an antenna, a power level detector for detecting a transmission power level from the power amplifier, and a comparator for comparing an outputted signal from the power level detector with a reference signal for controlling a gain of the gain controlled amplifier.

According to a second aspect of the present invention, there is provided a radio communication system having a base station and a subscriber unit, a transmission power from the subscriber unit is controlled by a power level control signal transmitted by the base station, and a power control circuit. In this radio communication system, the power control circuit for signal transmission provided in the subscriber unit is comprised of a modulator for modulating a first local oscillating signal by an inputted signal to be transmitted, a mixer for mixing the modulated signal with an output signal from a second local oscillating signal, the outputted signal being controlled by a gain controlled amplifier, an attenuator for attenuating an outputted signal from the mixer, an attenuation being controlled according to the power level control signal, a power amplifier for amplifying an outputted signal from the attenuator for radiating an amplified signal via an antenna, a power level detector for detecting a transmission power level from the power amplifier, and a comparator for comparing an outputted signal from the power level detector with a reference signal for controlling a gain of the controlled amplifier.

In accordance with a third aspect of the present invention, there is provided a power control method for use in a transmitter wherein a signal transmission power level is controlled by a power level control signal. This power control method is comprised of the steps of a modulating step for modulating a first local oscillating signal by an inputted signal to be transmitted, a mixing step for mixing the modulated signal with an outputted signal from a second local oscillating signal, the outputted signal being controlled by a gain control amplifier, an attenuation step for attenuating an outputted signal from the mixing step, attenuation being controlled according to the power level control signal, an amplifying step for amplifying an outputted signal from the attenuating step for radiating an amplified outputted signal via an antenna, a detection step for detecting a transmission power level from the amplifying step, and a comparison step for comparing an outputted signal from the detection step with a reference signal for controlling a gain of the gain controlled amplifier.

In accordance with a fourth aspect of the present invention, there is provided a radio communication system having a base station and a subscriber unit, a transmission power from the subscriber unit is controlled by a power level control signal transmitted by the base station, a power control method for signal transmission provided in the subscriber unit. The power control method is comprised of the steps of a modulation step for modulating a first local oscillating signal by an inputted signal to be transmitted, a mixing step for mixing the modulated signal with an output signal from a second local oscillating signal, the outputted signal being controlled by a gain controlled amplifier, an attenuation step for attenuating an outputted signal from the mixing step, an attenuation being controlled according to the power level control signal, a power amplifying step for amplifying an outputted signal from the attenuator for radiating an amplified signal via an antenna, a power level detection step for detecting a transmission power level from the power amplifier, and a comparison step for comparing an outputted signal from the power level detecting step with a reference signal for controlling a gain of the controlled amplifier.

DESCRIPTION OF THE PREFERRED EMBODIMENTS

According to the present invention, there is provided a radio communication system comprising a base station and a subscriber unit, and wherein a transmission output control signal for controlling a transmission output is transmitted from the base station to the subscriber unit to thereby control the transmission output power of the subscriber unit. A local oscillating signal is mixed with a signal from a modulator of the subscriber unit, and the mixed signal is supplied to a power amplifier. A step-attenuator whose attenuation is controlled in accordance with the transmission output control signal is provided between the modulator and the power amplifier. A part of the output from the power amplifier is processed by a directional coupler, and detected by a detector. The detected signal from the detector and a reference voltage are compared with each other by a comparator, and it is possible to obtain a transmission output power of a desired subscriber unit by controlling a level of the local oscillating signal mixed with the modulated signal from the modulator in response to a compared output from the comparator.

The present invention will now be described with reference to the drawings.

Figure 1:
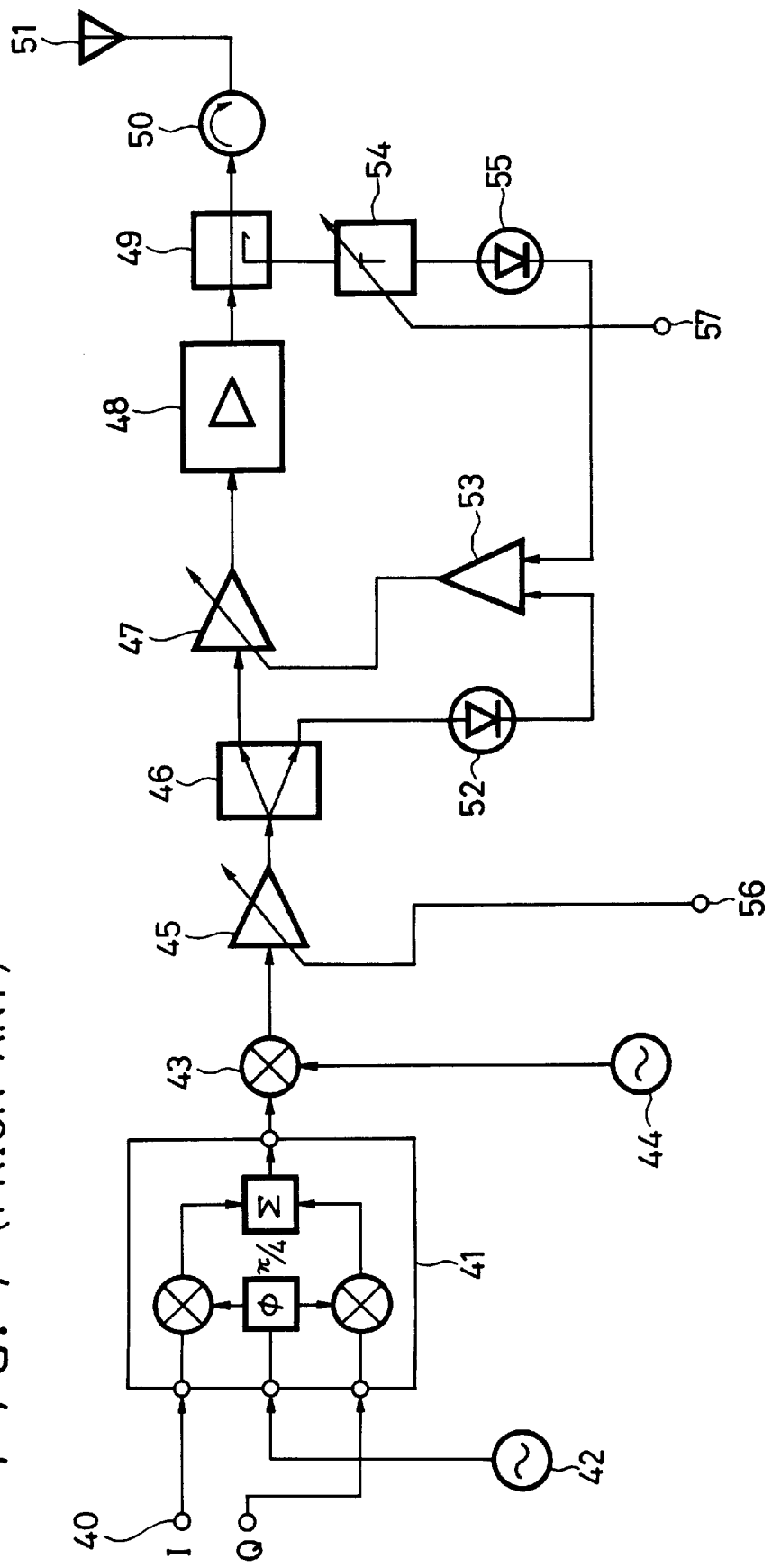
FIG. 1 is a block diagram used to explain an example of a conventional power control circuit.
Figure 2:
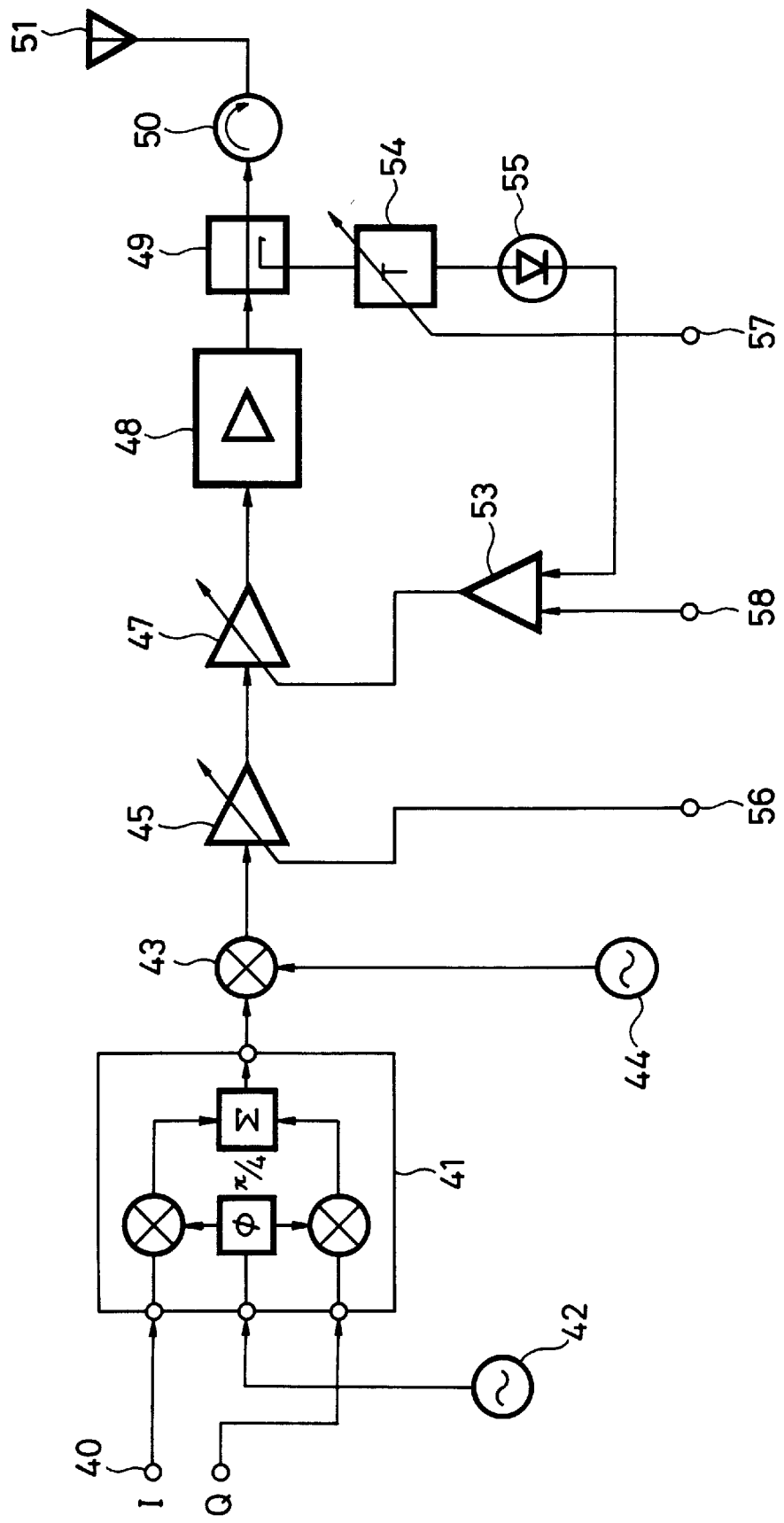
FIG. 2 is block diagram used to explain another example of a conventional power control circuit.
Figure 3:
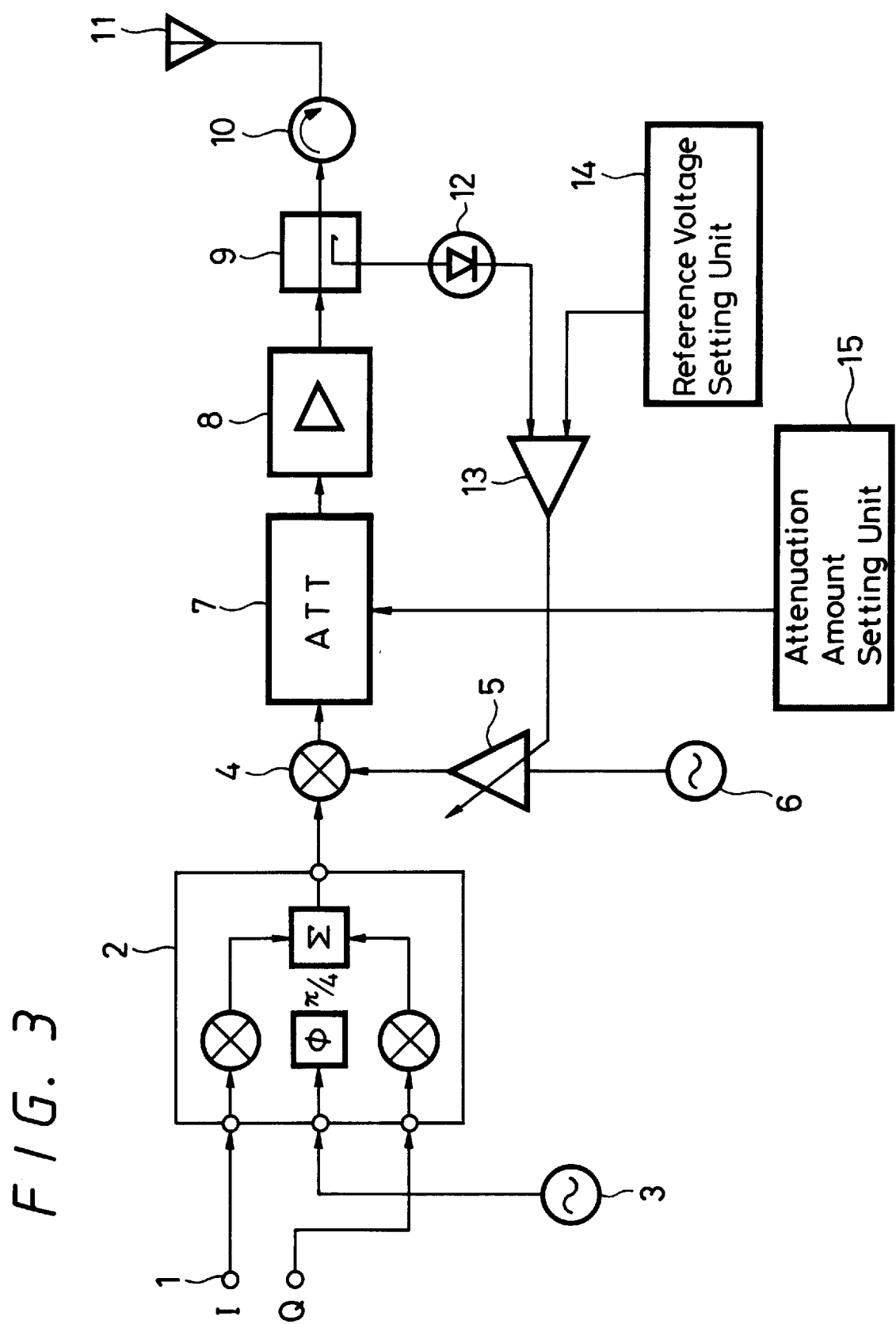
FIG. 3 is a block diagram showing an example of a transmitting circuit of a subscriber unit of a portable telephone system to which a power control circuit according to the present invention is applied.

FIG. 3 is a block diagram showing an example of a transmitting circuit of a subscriber unit of a portable telephone system to which a power control circuit according to the present invention is applied.

As shown in FIG. 3, baseband digital audio data I and Q which result from A/D-converting of an audio signal are supplied through an input terminal 1 to an orthogonal modulator 2, in which they are modulated by using the first local oscillating signal from a first local oscillator 3 as a carrier signal. The modulated signal from the orthogonal modulator 2 is supplied to a mixer 4. A second local oscillating signal from a second local oscillator 6 is supplied to the mixer 4 through a variable gain amplifier 5. Then, the mixer 4 mixes the second local oscillating signal to the modulated signal from the orthogonal modulator 2 to provide a transmission signal of 900 MHz band, for example.

The transmission signal from the mixer 4 is supplied through a step-attenuator (ATT) 7 to a power amplifier 8. The transmission output from the power amplifier 8 is supplied through a directional coupler 9 and an isolator 10 to an antenna 11. Further, the signal from the directional coupler 9 is supplied to a detector 12, in which it is converted into a DC voltage, and supplied to a comparator 13.

The reference voltage corresponding to the setting of the transmission output power and supplied from a reference voltage setting unit 14 is supplied to the comparator 13. The output from the comparator 13 is supplied to a control unit of the variable gain amplifier 5. Thus, the gain of the variable gain amplifier 5 is controlled such that the DC voltage from the detector 12 and the reference voltage from the reference voltage setting unit 14 become equal to each other.

Accordingly, in this circuit, when the subscriber unit with a transmission output of 0.8 W controls the transmission output power at the step of 4 dB in a range of from 0 to −20 dB where the maximum transmission output power is set to 0 dB, an attenuation amount of the step-attenuator 7 can be set at the step of 4 dB in the range of 20 dB. If the attenuation amount of the step-attenuator 7 is set by the attenuation amount setting unit 15 in accordance with the transmission output control signal from the base station, then the transmission output power supplied to the antenna 11 can be controlled at the step of 4 dB in a range of from 0 to −20 dB where the maximum transmission output power is set to 0 dB.

In this manner, the transmission output power of the base station is controlled in accordance with the transmission output control signal transmitted from the base station to the subscriber unit. Therefore, it is possible to prevent another base station from being troubled by interference caused by an excessively-large transmission level. Also, the power consumption of a battery housed in the subscriber unit can be lessened, and the life of the battery can be extended.

Further, in this circuit, the reference voltage from the above reference voltage setting unit 14 is set to be a proper value in response to the set transmission output power, whereby the comparator 13 outputs a difference component between the reference voltage and the DC voltage from the detector 12. Then, the output from the comparator 13 is supplied to the control unit of the variable gain amplifier 5, whereby the output from the mixer 4 becomes a constant output voltage regardless of the transmission output power.

Incidentally, the gain of the variable gain amplifier 5 is set such that a fluctuation of the output voltage of the orthogonal modulator 2 is corrected and that the output voltage of the orthogonal modulator 2 becomes close to the optimum operation point with a well-balanced distortion characteristic. The gain of the variable gain amplifier 5 is finely adjusted by the output from the comparator 13.

Specifically, in this circuit, since the output from the mixer 4 becomes a constant output power regardless of the transmission output power, if only the reference voltage from the reference voltage setting circuit 14 is set in response to the transmission output power, then the adjustment of the output power of the modulator 2 need not be carried out, and the temperature compensation also need not be carried out, thereby making it possible to remove the external complex circuit arrangement or the like.

Therefore, according to this circuit, unlike the conventional circuit which needs the variable gain amplifier for matching the output voltage of the orthogonal modulator with the optimum operation point by the variable gain amplifier and the external complex circuit arrangement for temperature-compensating the voltage of the signal whose gain is adjusted, the level of the mixed signal can be made constant by controlling the level of the local oscillating signal regardless of the transmission output power. Therefore, the output power of the modulator need not be adjusted and the temperature compensation need not be carried out. Hence, the transmission output can be controlled by the simple arrangement.

Figure 4:
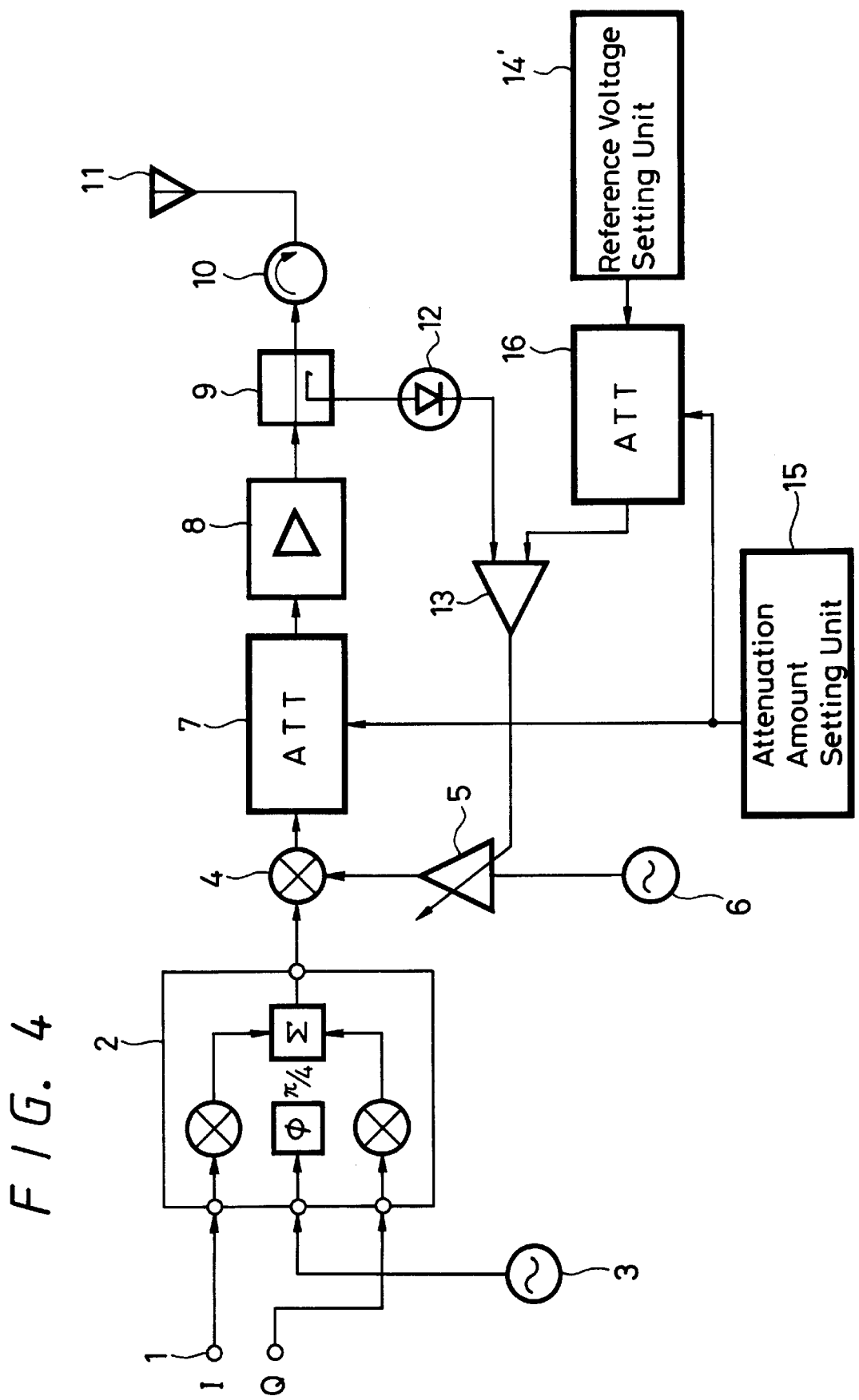
FIG. 4 is a block diagram showing other example of a transmitting circuit of a subscriber unit of a portable telephone system to which a power control circuit according to the present invention is applied.

FIG. 4 is a block diagram showing another example of a transmitting circuit of a subscriber unit of the portable telephone system to which the power control circuit according to the present invention is applied. As shown in FIG. 4, a step-attenuator (ATT) 16 is additionally provided between the comparator 13 and a reference voltage setting unit 14'. The rest of arrangement is similar to that of FIG. 3.

The attenuation amount setting unit 15 sets the attenuators 7 and 16 at the same attenuation amount in accordance with the transmission output control signal supplied thereto from the base station. However, the step-attenuator 7 is adapted to attenuate the transmission signal of 900 MHz band, and the step-attenuator 16 is adapted to attenuate a DC voltage.

According to the example shown in FIG. 4, the output voltage of the reference voltage setting unit 14 is fixed to the reference voltage obtained in the case of the maximum transmission output power, for example, and this reference voltage can be set to a proper value in response to the set transmission output power. Accordingly, the reference voltage setting unit 14' may stably generate a predetermined reference voltage, and the circuit arrangement of this reference voltage setting unit 14' can be simplified.

Figure 5:
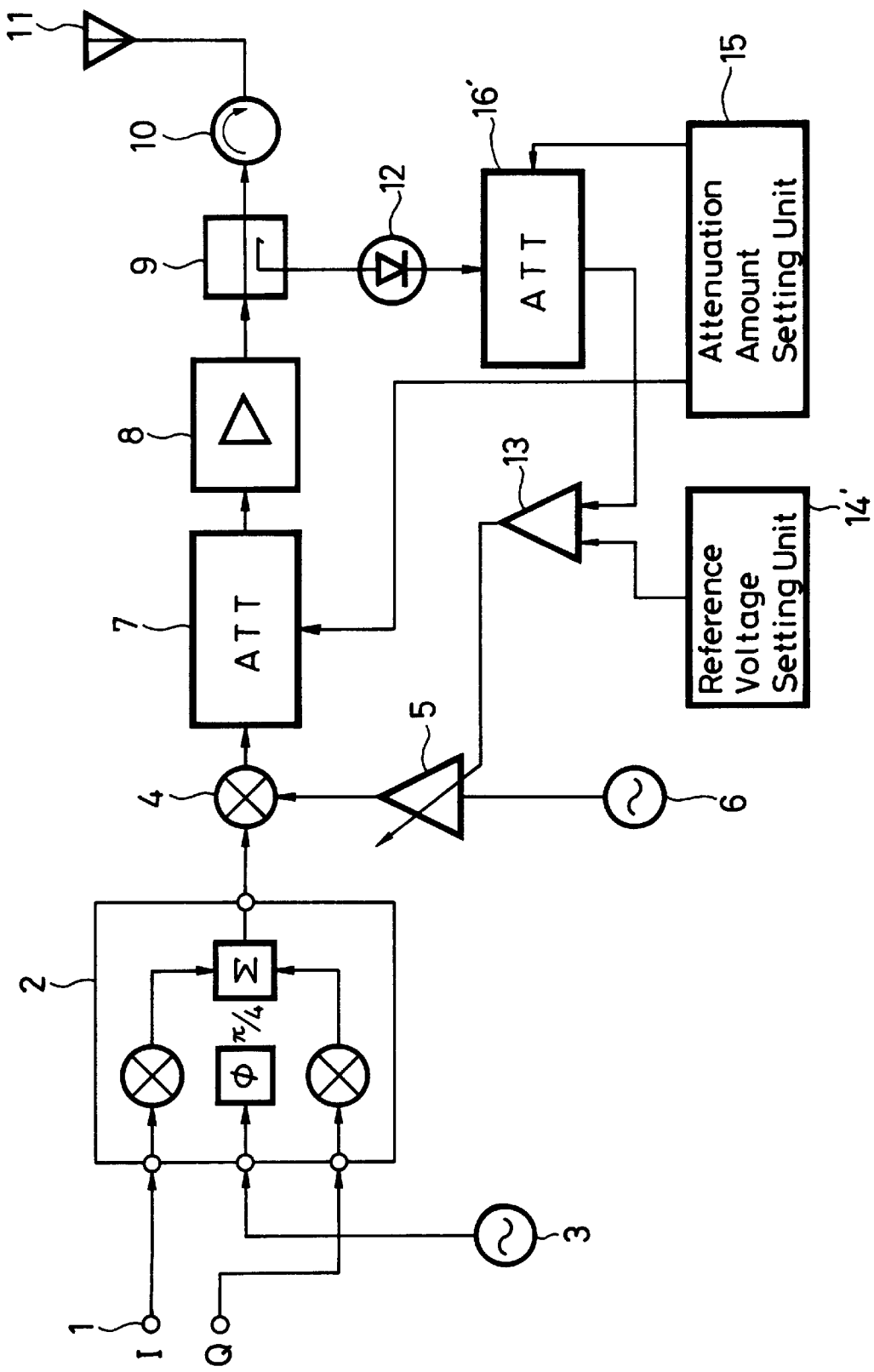
FIG. 5 is a block diagram showing a further example of a transmitting circuit of a subscriber unit of a portable telephone system to which a power control circuit according to the present invention is applied.

FIG. 5 is a block diagram showing a further example of a transmitting circuit of a subscriber unit of a portable telephone system to which a power control circuit according to the present invention is applied. In the example shown in FIG. 5, the step-attenuator (ATT) 16' is additionally provided between the detector 12 and the comparator 13. The rest of arrangement is similar to that of FIG. 3.

The attenuation amount setting unit 15 sets the attenuation amounts of the step-attenuators 7 and 16' in opposite directions in accordance with the transmission output control signal from the base station. Specifically, the attenuation amount of the step-attenuator 16' is set in the reverse direction to that of the step-attenuator 7 in such a way as to increase the attenuation amount of the step-attenuator 16' when the transmission output power is increased and to decrease the attenuation amount of the step-attenuator 16' when the transmission output power is decreased.

According to the example shown in FIG. 5, the level of the signal corresponding to the transmission output power supplied from the detector 12 to the comparator 13 is controlled by the step-attenuator 16'. Accordingly, since the operation point (output of the step-attenuator 16' and output of the reference voltage setting unit 14') of the comparator 13 becomes a constant value and the operation point of the orthogonal modulator 2 is always constant, this circuit can constantly obtain a constant time response of the transmission output power.

Figure 6:
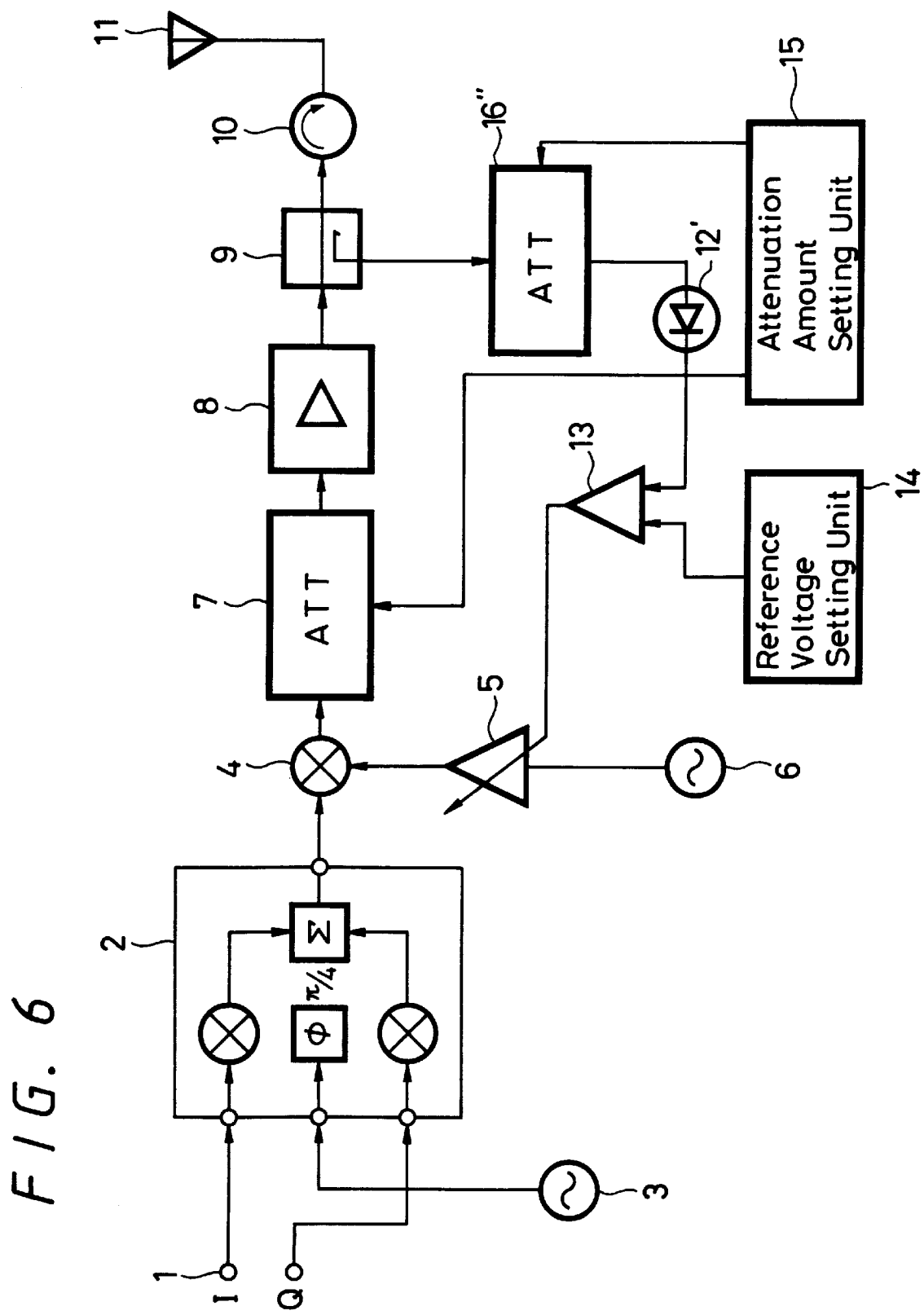
FIG. 6 is a block diagram showing a modified example of a transmitting circuit shown in FIG. 5.

In a modified example shown in FIG. 6, the step-attenuator 16" may be interposed between the directional coupler 9 and the detector 12 with similar action and effects being achieved. If the step-attenuator 16" is provided between the directional coupler 9 and the detector 12, then the DC voltage has to be attenuated. If the step-attenuator 16" is provided between the directional coupler 9 and the detector 12, then a transmission signal of 900 MHz band, for example, has to be attenuated.

As described above, according to the power control circuit, in the radio communication system comprising the base station and the subscriber unit and in which the transmission output power of the subscriber unit is controlled by supplying the transmission output control signal for controlling the transmission output from the base station to the subscriber unit, the local oscillating signal is mixed to the signal from the modulator of the subscriber unit, and supplied to the power amplifier. The step-attenuator whose attenuation is controlled in response to the transmission output control signal is provided between the modulator and the power amplifier. A part of the output of the power amplifier is processed by the directional coupler, the output of the directional coupler is detected by the detector, and compared with the reference voltage by the comparator. Then, the transmission output power of a desired subscriber unit can be obtained by controlling the level of the local oscillating signal mixed to the signal from the modulator in response to the output from the comparator. Therefore, the level of the mixed signal becomes a constant output power regardless of the transmission output power. Hence, the output voltage of the modulator need not be adjusted, and the temperature compensation need not be carried out, thereby making it possible to control the transmission output with the simple arrangement.

The power control circuit according to the present invention is not limited to the transmitting circuit of the subscriber unit in the portable telephone system, for example. Furthermore, when the power control circuit according to the present invention is applied to the transmitting circuit, the modulator is not limited to the above-mentioned orthogonal modulator.

According to the present invention, the local oscillating signal is mixed to the signal from the modulator, and supplied to the power amplifier. The step-attenuator whose attenuation amount is controlled in response to the transmission output control signal is provided between the modulator and the power amplifier, the detected signal which results from detecting a part of the output from the power amplifier and the reference voltage are compared, and the level of the local oscillating signal mixed to the signal from the modulator is controlled in accordance with the compared output, whereby the level of the mixed signal can be constantly made constant regardless of the transmission output power. Therefore, the output power of the modulator need not be adjusted, and the temperature compensation need not be carried out. Thus, the transmission output can be controlled by the simple arrangement.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A power control circuit for use in a transmitter having an antenna wherein a signal transmission power level is controlled by a power level control sginal, said power control circuit comprising:

a modulator for modulating an input signal to be transmitted by a first local oscillating signal;

a mixer for mixing said modulated input signal with a power adjusted second local oscillating signal;

a variable gain control amplifier for adjusting a power of a second local oscillating signal fed thereto in response to a control signal and producing said power adjusted second local oscillator signal fed to said mixer;

an attenuator for attenuating a signal output from said mixer, wherein attenuation of said signal output from said mixer is controlled according to said power level control signal;

a power amplifier for amplifying a signal output from said attenuator and for radiating an amplified output signal via said antenna;

a power level detector for detecting a transmission power level of said amplified signal from said power amplifier; and a comparator for comparing the transmission power level output from said power level detector with a reference signal corresponding to a setting of the transmission output power for producing said control signal for adjusting a gain of said variable gain controlled amplifier in response to the comparison.

2. The power control circuit in accordance with claim 1, further comprising a second attenuator for attenuating said reference signal, wherein said second attenuator is controlled according to said power level control signal.

3. The power control circuit in accordance with claim 1, further comprising a second attenuator for attenuating said outputted signal from said power level detector, wherein said second attenuator is controlled by said power level control signal.

4. The power control circuit in accordance with claim 1, wherein said power level detector comprises a directional coupler for coupling to said amplified signal from said power amplifier and a diode detector receiving a coupled output signal from said directional coupler and further comprising a second attenuator for attenuating a coupled output signal from said directional coupler before supplying said coupled output signal to said diode detector, wherein said second attenuator is controlled according to said power level control signal.

5. In a radio communication system having a base station and a subscriber unit having an antenna, wherein a transmission power from said subscriber unit is controlled by a power level control signal transmitted by said base station, a power control circuit for signal transmission provided in said subscriber unit comprising:

a modulator for modulating an input signal to be transmitted by a first local oscillating signal;

a mixer for mixing said modulated input signal with a power adjusted second local oscillating signal;

a variable gain controlled amplifier for adjusting a power of a second local oscillating signal in response to a control signal fed thereto and producing said power adjusted second local oscillator signal fed to said mixer;

an attenuator for attenuating a signal output from said mixer, an attenuation of said signal output from said mixer being controlled according to said power level control signal transmitted by said base station;

a power amplifier for amplifying a signal output from said attenuator and for radiating an amplified output signal via said antenna;

a power level detector for detecting a transmission power level of said amplified output signal from said power amplifier; and a comparator for comparing the transmission power level output from said power level detector with a reference signal corresponding to a setting of the transmission output power and producing said control signal for adjusting a gain of said variable gain controlled amplifier based on a comparison output.

6. The power control circuit in accordance with claim 5, further comprising a second attenuator for attenuating said reference signal, wherein said second attenuator is controlled according to said power level control signal.

7. The power control circuit in accordance with claim 5, further comprising a second attenuator for attenuating said signal output from said power level detector, wherein said second attenuator is controlled by said power level control signal.

8. The power control circuit in accordance with claim 5, wherein said power level detector comprises a directional coupler for coupling to said amplified signal from said power amplifier and a diode detector receiving an output signal from said directional coupler and further comprising a second attenuator for attenuating said output signal from said directional coupler before supplying said output signal to said diode detector, wherein said second attenuator is controlled according to said power level control signal.

9. A power control method for use in a transmitter, wherein a signal transmission power level is controlled by a power level control signal, said power control method comprising:

a modulation step for modulating an input signal to be transmitted by a first local oscillating signal;

a mixing step for mixing said modulated input signal with a power adjusted second local oscillating signal a gain control amplifying step for adjusting a gain of a second local oscillating signal in response to a control signal fed thereto and producing said power adjusted second local oscillating signal used in said mixing step;

an attenuating step of attenuating a mixed signal output from said mixing step, wherein attenuation of said mixed signal from said mixing step is controlled according to said power level control signal;

an amplifying step for amplifying an outputted signal from said attenuating step and for radiating said amplified outputted signal via an antenna;

a power level detection step for detecting a transmission power level from said amplifying step;

a comparison step for comparing the detected transmission power level from said power level detecting step with a reference signal and producing said control signal; and adjusting a gain of said gain controlled amplifier by said control signal produced as a result of the comparison and producing said power adjusted second local oscillating signal.

10. The power control method in accordance with claim 9, further comprising a second attenuating step of attenuating said reference signal, wherein said second attenuating step is controlled according to said power level control signal.

11. The power control method in accordance with claim 9, further comprising a second attenuating step of attenuating said signal output from said power level detecting step, wherein said second attenuating step is controlled by said power level control signal.

12. The power control method in accordance with claim 9, wherein said power level detection step includes coupling a directional coupler to said amplified outputted signal and detecting an output power in a coupled signal obtained by said coupling step and further comprising a second attenuating step of attenuating said coupled signal obtained by said coupling step before supplying said coupled signal to said step of detecting an output power, wherein said second attenuating step is controlled according to said power level control signal.

13. In a radio communication system having a base station and a subscriber unit, wherein a transmission power from said subscriber unit is controlled by a power level control signal transmitted by said base station, a power control method for signal transmission performed in said subscriber unit comprising:

a modulation step for modulating an input signal to be transmitted by a first local oscillating signa;

a mixing step for modulating an input signal to be transmitted by a first local oscillating signa;

a mixing step for mixing said modulated input signal with a power adjusted second local oscillating signal a gain control amplifying step for adjusting a gain of a second local oscillating signal in response to a control signal fed thereto and producing said power adjusted second local oscillator signal used in said mixing step;

an attenuating step for attenuating a mixed signal output from said mixing step, wherein attenuation of said mixed signal from said mixing step is controlled according to said power level control signal;

an amplifying step for amplifying a signal output from said attenuating step and for radiating an amplified output signal via an antenna;

a power level detection step for detecting a transmission power level of the amplified output signal from said amplifying step;

a comparison step for comparing the detected power transmission from said detecting step with a reference signal and producing said control signal; and adjusting a gain of said gain controlled amplifier by said control signal produced as a result of the comparison step.

14. The power control method in accordance with claim 13, further comprising a second attenuating step of attenuating said reference signal, wherein said second attenuating step is controlled according to said power level control signal.

15. The power control method in accordance with claim 13, further comprising a second attenuating step of attenuating said signal output from said power level detecting step, wherein said second attenuating step is controlled by said power level control signal.

16. The power control method in accordance with claim 13, wherein said power level detection step includes a coupling step of coupling a directional coupler to said amplified outputted signal and detecting an output power level in a coupled signal produced by said coupling step and further comprising a second attenuating step of attenuating said coupled signal from said step of coupling before said detecting step, wherein said second attenuating step is controlled according to said power level control signal.

* * * * *